US008923418B2

(12) United States Patent
Bendixen et al.

(10) Patent No.: US 8,923,418 B2
(45) Date of Patent: Dec. 30, 2014

(54) PHASE SHIFTING STAGE FOR SWITCHLESS DE-MULTIPLEXING

(75) Inventors: Jeppe Korshøj Bendixen, Vrå (DK); Ruediger Bauder, Feldkirchen-Westerham (DE)

(73) Assignee: RF Micro Devices, Inc., Greensboro, NC (US)

( * ) Notice: Subject to any disclaimer, the term of this patent is extended or adjusted under 35 U.S.C. 154(b) by 279 days.

(21) Appl. No.: 13/422,477

(22) Filed: Mar. 16, 2012

(65) Prior Publication Data

US 2012/0243586 A1  Sep. 27, 2012

Related U.S. Application Data

(60) Provisional application No. 61/467,566, filed on Mar. 25, 2011.

(51) Int. Cl.
*H04B 3/00* (2006.01)
*H03H 11/32* (2006.01)
*H03H 11/22* (2006.01)

(52) U.S. Cl.
CPC ............. *H03H 11/32* (2013.01); *H03H 11/22* (2013.01)
USPC ........................................ 375/258

(58) Field of Classification Search
CPC .... H04F 3/45; H04F 3/45071; H04F 3/45076
USPC .................................. 375/257, 258
See application file for complete search history.

(56) References Cited

U.S. PATENT DOCUMENTS

| 4,270,061 | A | 5/1981 | Gronner et al. |
| 5,247,264 | A | 9/1993 | Cripe |
| 7,343,138 | B2 | 3/2008 | Bengtson et al. |
| 8,604,874 | B2 | 12/2013 | Bendixen |
| 2003/0128071 | A1* | 7/2003 | Nguyen et al. ................ 330/254 |
| 2006/0006950 | A1* | 1/2006 | Burns et al. ................... 330/311 |
| 2008/0117894 | A1 | 5/2008 | McMorrow |
| 2010/0328968 | A1 | 12/2010 | Adragna et al. |
| 2011/0310775 | A1 | 12/2011 | Khlat et al. |
| 2014/0016517 | A1 | 1/2014 | Khlat et al. |

OTHER PUBLICATIONS

Aoki, I. et al., "A fully-integrated 1.8-V, 2.8-W, 1.9-GHz, CMOS Power Amplifier," IEEE Radio Frequency Integrated Circuits Symposium, Jun. 2003, pp. 199-202.

(Continued)

*Primary Examiner* — Kevin M Burd
(74) *Attorney, Agent, or Firm* — Withrow & Terranova, P.L.L.C.

(57) ABSTRACT

A phase shifting stage is disclosed. The phase shifting stage includes first and second transistors. Second terminals of the first transistor and the second transistor are coupled to a first current tail node. A third transistor and a fourth transistor have second terminals that are coupled to a second current tail node. Also included is a first transformer having a primary winding with first and second inputs and a secondary winding. The first input is coupled to the first terminals of the first and third transistors, and the second input is coupled to the first terminals of the second and the fourth transistors. A common input stage having high power gain and phase commutating cascode stages in asymmetrical transformer output demultiplexing (ATODEM) branches is also provided. The common input stage limits the noise generated at an input stage by substantially canceling out the noise at an output transformer of the ATODEM.

16 Claims, 8 Drawing Sheets

(56) References Cited

OTHER PUBLICATIONS

An, K. et al., "Power-combining transformer techniques for fully-integrated CMOS power amplifiers," IEEE Journal of Solid-State Circuits, vol. 43, No. 5, May 2008, pp. 1034-1075.

Jang, J. et al., "A CMOS RF power amplifier using an off-chip transmission line transformer with 62% PAE," IEEE Microwave and Wireless Components Letters, vol. 17, No. 5, May 2007, pp. 385-387.

Lee, H. et al., "A quasi-four-pair class-E CMOS RF power amplifier with an integrated passive device transformer," IEEE Transactions on Microwave Theory and Techniques, vol. 57, No. 4, Apr. 2009, pp. 752-759.

Park, C. et al., "Tournament-shaped magnetically coupled power-combiner architecture for RF CMOS power amplifier," IEEE Transactions on Microwave Theory and Techniques, vol. 55, No. 10, Oct. 2007, pp. 2064-2042.

Park, C. et al., "A 1/9-GHz CMOS power amplifier using three-port asymmetric transmission line transformer for a polar transmitter," IEEE Transactions on Microwave Theory and Techniques, vol. 55, No. 2, Feb. 2007, pp. 230-238.

* cited by examiner

PHASE SHIFTING STAGE FOR SWITCHLESS DE-MULTIPLEXING

RELATED APPLICATIONS

This application claims the benefit of provisional patent application Ser. No. 61/467,566, filed Mar. 25, 2011, the disclosure of which is hereby incorporated herein by reference in its entirety. This application is related to U.S. patent application Ser. No. 13/247,085 entitled ASYMMETRICAL TRANSFORMER OUTPUT DEMULTIPLEXING (ATODEM) CIRCUIT filed Sep. 28, 2011, now U.S. Pat. No. 8,729,963, the disclosure of which is incorporated herein by reference in its entirety.

FIELD OF THE DISCLOSURE

The present disclosure relates to a phase shifting stage for providing 180° phase shifts.

BACKGROUND

Multi-mode and multi-band power amplifiers (PAs) typically have a mode switch or a band switch that is used to select between modes or between bands. Mode switches and band switches add costs and insertion losses that are detrimental to the economics and the performance of the multi-mode and multi-band PAs. Another efficiency loss is due to a constraint of a single load-line for typical multi-mode and multi-band PAs. The single load-line can only be optimized for one mode or one band of operation. Usually, the single load-line is adjusted to provide a best comprise in performance between various modes and bands of operation. However, even the best comprise for the single load-line results in less than desirable inefficiencies that limit operation time of battery operated user equipment (UE) such as mobile terminals. As such, there is a need to replace the mode switch and/or band switch for multi-mode and multi-band PAs with a switching structure that has reduced insertion losses as well as multiple load-lines that are optimized for individual modes and/or bands of operation.

SUMMARY

A phase shifting stage is disclosed. The phase shifting stage includes first and second transistors that each have a first terminal, a second terminal, and a control terminal, wherein the second terminals of the first transistor and the second transistor are coupled to a first current tail node. A third transistor and a fourth transistor each have a first terminal, a second terminal, and a control terminal, wherein the second terminals of the third transistor and the fourth transistor are coupled to a second current tail node. Also included is a first transformer having a primary winding with first and second inputs and a secondary winding with first and second outputs, wherein the first input is coupled to the first terminals of the first and third transistors, and wherein the second input is coupled to the first terminals of the second and the fourth transistors.

In one embodiment, the phase shifting stage further includes a controller having a first control signal that is communicatively coupled to the control terminals of the first transistor and the second transistor and a second control signal that is communicatively coupled to the control terminals of the third transistor and the fourth transistor. In this embodiment, the controller is adapted to route a radio frequency (RF) signal coupled to control input of the first transistor and the control input of the second transistor through the primary winding of the first transformer in one direction by switching on the first transistor and the second transistor via the first control signal while switching off the third transistor and the fourth transistor via the second control signal. Moreover, the controller is further adapted to route the RF signal coupled to control input of the first transistor and the control input of the second transistor through the primary winding of the first transformer in an opposite direction by switching off the first transistor and the second transistor via the first control signal while switching on the third transistor and the fourth transistor via the second control signal.

In yet another embodiment, a common input stage having high power gain and phase commutating cascode stages in asymmetrical transformer output demultiplexing (ATODEM) branches is also provided. The structure of the common input stage guarantees that noise generated at an input stage is correlated in two branches. As such, the noise from a first stage will cancel out at an output transformer of the ATODEM.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

Figure 1:
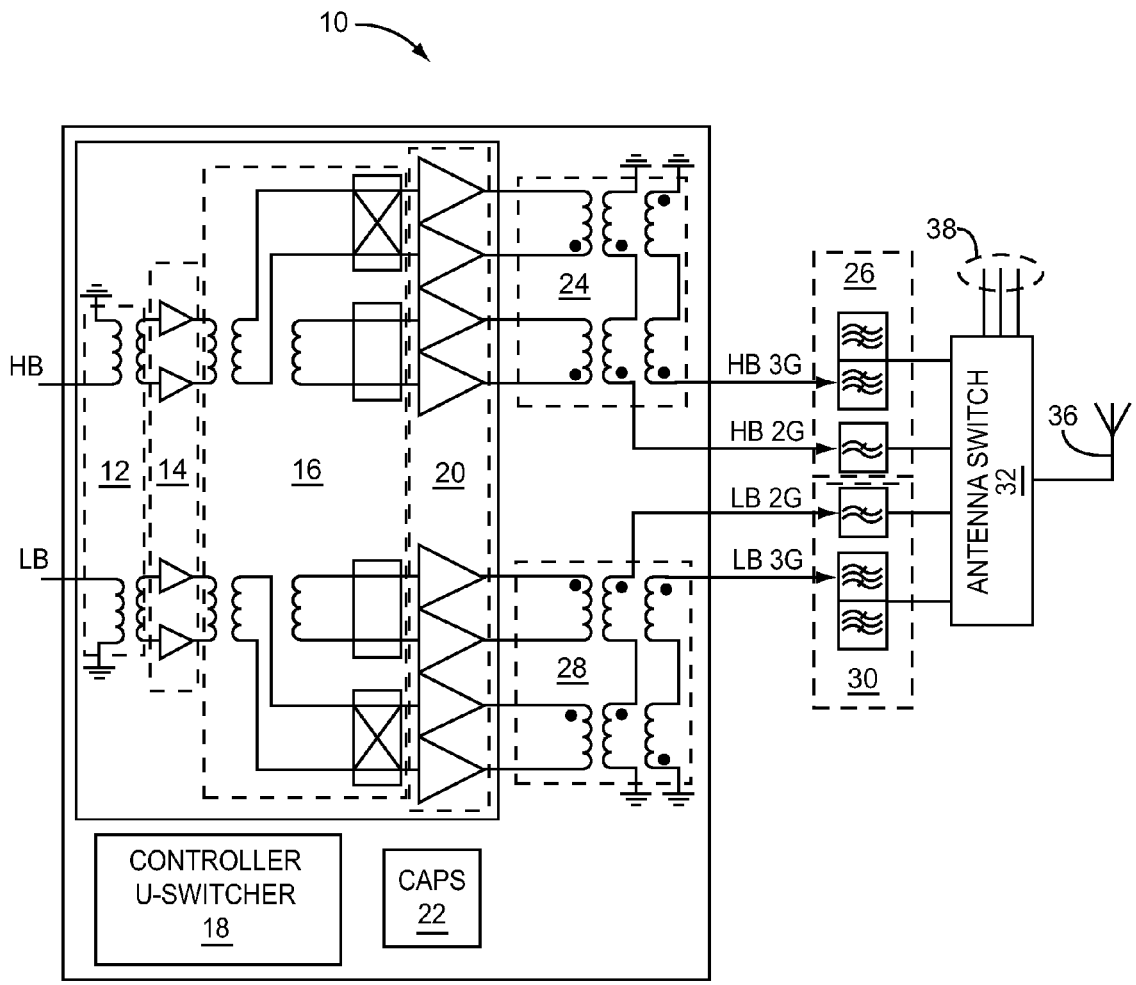
FIG. 1 is a related art asymmetrical transformer output demultiplexing (ATODEM) system that can be improved by phase shifting stages of the present disclosure.

FIG. 1 is a related art asymmetrical transformer output demultiplexing (ATODEM) system 10 that can be improved by phase shifting stages of the present disclosure. The ATODEM system 10 includes balanced/unbalanced (baluns) 12. One of the baluns 12 has a high band (HB) input and the other of the baluns 12 has a low band (LB) input. Drivers 14 receive output from baluns 12 to feed preamplified HB and LB signals to phase shifting circuitry 16. The phase shifting circuitry 16 is controlled and powered by a controller and μ-switcher power converter module 18. Power amplifier (PA) stages 20 amplify HB and LB signals output from the phase shifting circuitry 16. The PA stages 20 are powered by the controller and μ-switcher power converter module 18. Capacitors (CAPS) 22 filter power delivered to the PA stages 20.

A first ATODEM 24 receives HB signals from the PA stages 20. Depending upon a switching state of the phase shifting circuitry 16, either a HB third generation (3G) or a HB second generation (2G) signal will be output from the first ATODEM 24. HB filters 26 are usable to filter the HB 3G and HB 2G signals.

A second ATODEM 28 receives LB signals from the PA stages 20. Depending upon a switching state of the phase shifting circuitry 16, either a LB 3G signal or a LB 2G signal will be output from the second ATODEM 28. HB filters 30 are usable to filter the HB 3G and HB 2G signals. An antenna switch 32 receives de-multiplexed HB and LB signals. A selected one of the de-multiplexed signals is passed through the antenna switch 32 to an antenna 36 based upon a state of antenna switch selector inputs 38.

Figure 2:
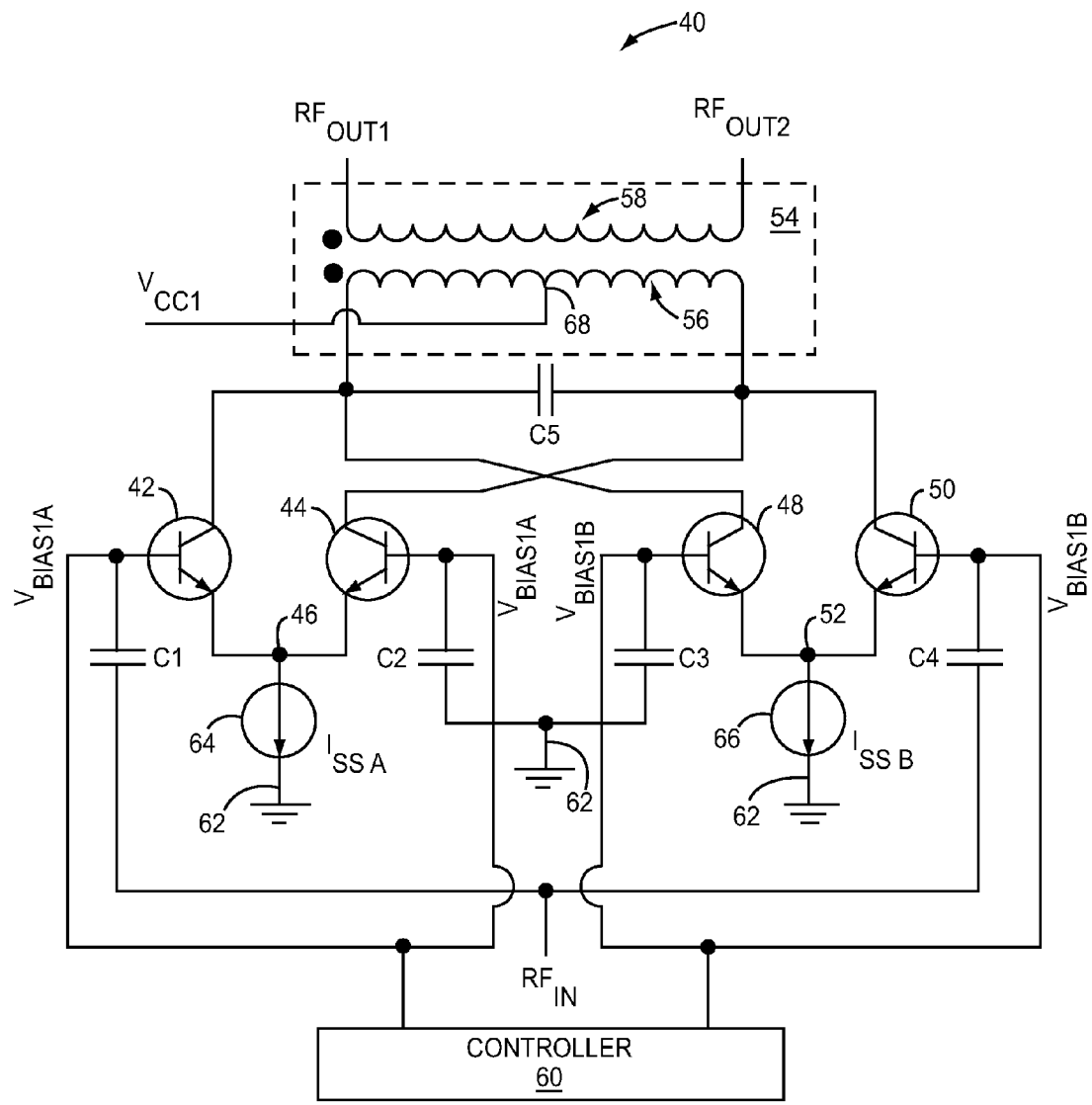
FIG. 2 is a schematic diagram of a phase shifting stage according to the present disclosure.

FIG. 2 is a schematic diagram of a phase shifting stage 40 according to the present disclosure. The first phase shifting stage 40 includes a first transistor 42 and a second transistor 44 that each have a first terminal, a second terminal, and a control terminal, wherein the second terminals of the first transistor 42 and the second transistor 44 are coupled to a first current tail node 46. A third transistor 48 and a fourth transistor 50 each have a first terminal, a second terminal, and a control terminal, wherein the second terminals of the third transistor 48 and the fourth transistor 50 are coupled to a second current tail node 52. The first phase shifting stage 40 also includes a first transformer 54 that has a primary winding 56 with a first input, a second input, and a secondary winding 58 with a first output and a second output, wherein the first input is coupled to the first terminals of the first transistor 42 and the third transistor 48, and wherein the second input is coupled to first terminals of the second transistor 44 and the fourth transistor 50.

A controller 60 outputs a first control signal $V_{BIAS1A}$ that is communicatively coupled to the control terminals of the first transistor 42 and the second transistor 44. The controller 60 also outputs a second control signal $V_{BIAS1B}$ that is communicatively coupled to the control terminals of the third transistor 48 and the fourth transistor 50.

An RF input terminal ($RF_{IN}$) receives an RF signal that is alternating current (AC) coupled to the control terminal of the first transistor 42 through a capacitor C1. The control terminals of the second transistor 44 and the third transistor 48 are AC coupled to a common node 62 through a second capacitor C2 and a third capacitor C3. The common node 62 is typically at ground potential. The RF signal is also coupled to the control terminal of the fourth transistor 50. A fifth capacitor C5 is coupled between the first input and the second input of the primary winding 56 to suppress voltage transient spikes.

A first current source 64 is coupled between the first current tail node 46 and the common node 62. The first current source 64 maintains a relatively constant current $I_{SSA}$ that flows through the first current tail node 46 to the common node 62. A second current source 66 is coupled between the second current tail node 52 and the common node 62. The second current source 66 maintains a relatively constant current $I_{SSB}$ that flows through the second current tail node 52 and the common node 62. A voltage source VCC1 powers the first phase shifting stage 40 by delivering power through a tap 68 in the primary winding 56.

Figures 3A, 3B:
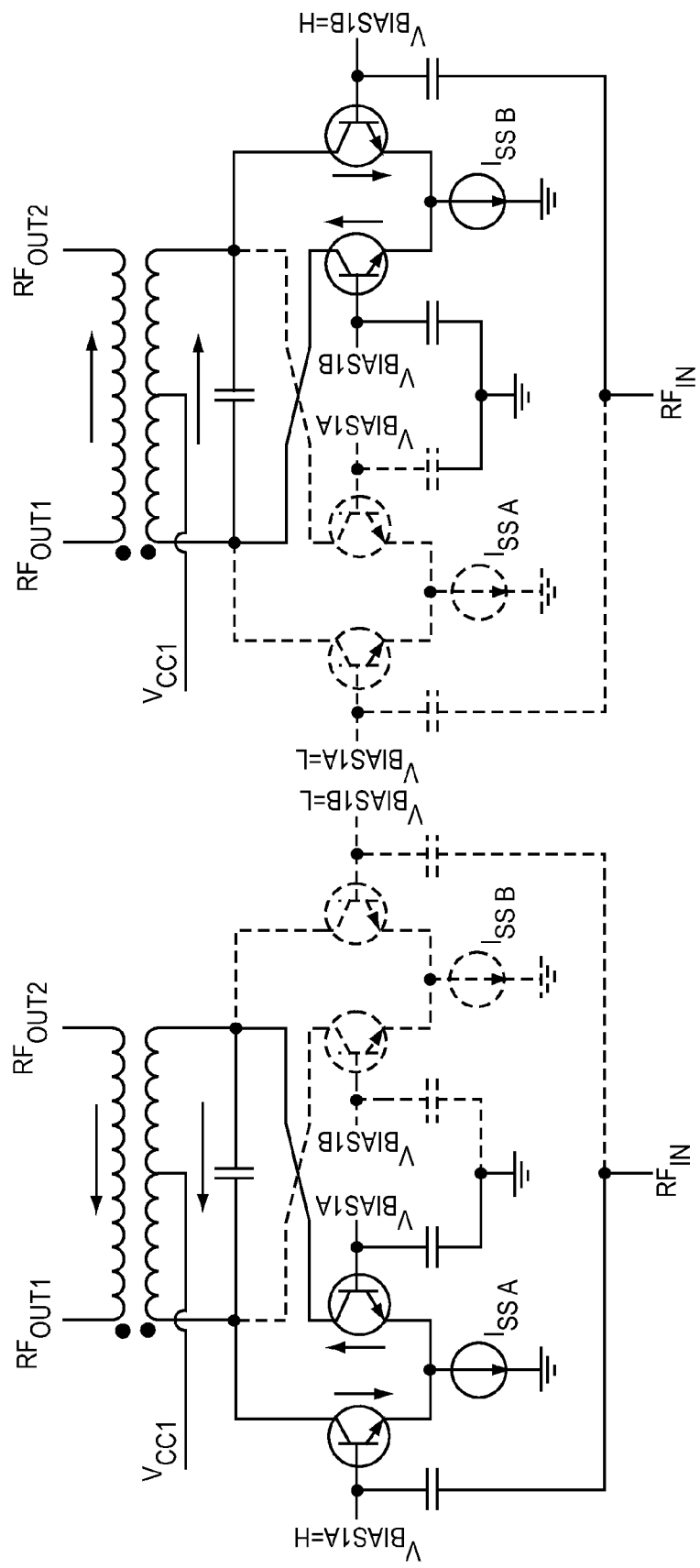
FIG. 3A is an operational schematic diagram of the phase shifting stage of FIG. 2 showing a radio frequency (RF) signal being routed through a primary winding of a first transformer.
FIG. 3B is an operational schematic diagram of the phase shifting stage of FIG. 2 showing the RF signal being routed through the primary winding in a direction that is opposite of the direction shown in FIG. 3A.

FIG. 3A is an operational schematic diagram of the first phase shifting stage 40 showing a radio frequency (RF) signal being routed through the primary winding 56 of the first transformer 54 in a first direction as indicated by a direction arrow adjacent to the primary winding 56. An off state for the third transistor 48, the fourth transistor 50, and the second current source 66 is represented by showing these components with dashed lines. Non-active signal paths are also shown with dashed lines. The controller 60 (FIG. 2) turns on the first transistor 42, the second transistor 44, and the first current source 64 by outputting a relatively high voltage H for the first control signal $V_{BIAS1A}$. At relatively the same time, the controller 60 turns off the third transistor 48, the fourth transistor 50 and the second current source 66 by outputting a relatively low voltage L for the second control signal $V_{BIAS1B}$. In this way, the RF signal is routed in a direction that passes the RF signal through the second transistor 44, through the primary winding 56, and through the first transistor 42.

FIG. 3B is an operational schematic diagram of the first phase shifting stage 40 showing a radio frequency (RF) signal being routed through the primary winding 56 of the first transformer 54 in a second direction as indicated by a direction arrow adjacent to the primary winding 56. An off state for the first transistor 42, the second transistor 44, and the first current source 64 is represented by showing these components with dashed lines. Non-active signal paths are also shown with dashed lines. The controller 60 (FIG. 2) turns off the first transistor 42, the second transistor 44, and the first current source 64 by outputting a relatively low voltage L for the first control signal $V_{BIAS1A}$. At relatively the same time, the controller 60 turns on the third transistor 48, the fourth transistor 50, and the second current source 66 by outputting a relatively high voltage H for the second control signal $V_{BIAS1B}$. In this way, the RF signal is routed in a direction that passes the RF signal through the third transistor 48, through the primary winding 56 and through the fourth transistor 50.

The first direction taken by the RF signal shown in FIG. 3A is opposite the second direction taken by the RF signal shown in FIG. 3B. As a result of the different directions taken by the RF signal, an output of the RF signal at terminals $RF_{OUT1}$ and $RF_{OUT2}$ during the operation of the first phase shifting stage 40 as shown in FIG. 3A will be 180° out of phase when compared to the output of the RF signal at terminals $RF_{OUT1}$ and $RF_{OUT2}$ during the operation of the first phase shifting stage 40 as shown in FIG. 3B.

Figure 4:
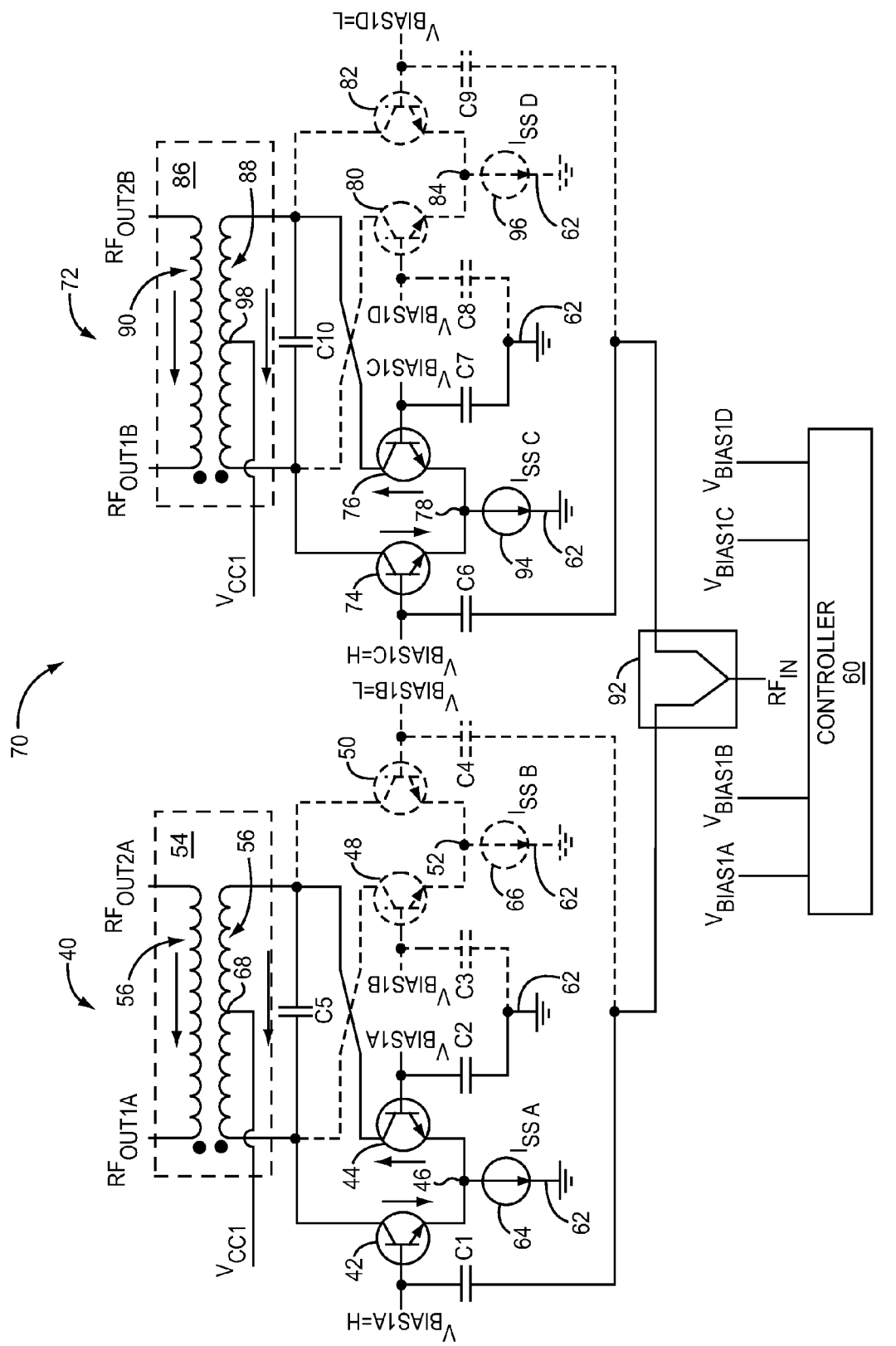
FIG. 4 is an operational schematic diagram showing the phase shifting stage of FIG. 3A in conjunction with a second phase shifting stage in a similar operational state.

FIG. 4 is an operational schematic diagram of a multiplexer 70 showing the first phase shifting stage 40 of FIG. 3A in conjunction with a second phase shifting stage 72 that is operating in a similar operational state. The second phase shifting stage 72 includes a fifth transistor 74 and a sixth transistor 76 that each has a first terminal, a second terminal, and a control terminal, wherein the second terminals of the fifth transistor 74 and the sixth transistor 76 are coupled to a third current tail node 78. A seventh transistor 80 and an eighth transistor 82 each have a first terminal, a second terminal, and a control terminal, wherein the second terminals of the seventh transistor 80 and the eighth transistor 82 are coupled to a fourth current tail node 84. The second phase shifting stage 72 also includes a second transformer 86 that has a primary winding 88 with a first input, a second input and a secondary winding 90 with a first output and a second output, wherein the first input is coupled to the first terminals of the fifth transistor 74 and the seventh transistor 80, and wherein the second input is coupled to first terminals of the sixth transistor 76 and the eighth transistor 82.

The controller 60 is further adapted to output a third control signal $V_{BIAS1C}$ that is communicatively coupled to the control terminals of the fifth transistor 74 and the sixth transistor 76. The controller 60 is also further adapted to output a fourth control signal $V_{BIAS1D}$ that is communicatively coupled to the control terminals of the seventh transistor 80 and the eighth transistor 82.

An RF input terminal ($RF_{IN}$) receives an RF signal that is split via a power splitter 92. A portion of the RF signal is AC coupled to the control terminal of the first transistor 42 through the capacitor C1. A remaining portion of the RF signal is AC coupled to the fifth transistor 74 through a capacitor C6. The control terminals of the sixth transistor 76 and the seventh transistor 80 are AC coupled to the common node 62 through a seventh capacitor C7 and a eighth capacitor C8. The common node 62 is typically at ground potential. The remaining portion of the RF signal is AC coupled to the control terminal of the eighth transistor 82 through a capacitor C9. A tenth capacitor C10 is coupled between the first input and the second input of the primary winding 88 to suppress voltage transient spikes.

A third current source 94 is coupled between the third current tail node 78 and the common node 62. The third current source 94 maintains a relatively constant current $I_{SSC}$ that flows through the third current tail node 78 to the common node 62. A fourth current source 96 is coupled between the fourth current tail node 84 and the common node 62. The fourth current source 96 maintains a relatively constant current $I_{SSD}$ that flows through the fourth current tail node 84 and the common node 62. The voltage source VCC1 powers the second phase shifting stage 72 by delivering power through a tap 98 in the primary winding 88.

In an operational example of the multiplexer 70, the controller 60 outputs a logic high (H) for the signal $V_{BIAS1A}$. The logic H for the signal $V_{BIAS1A}$ turns on both the first transistor 42 and the second transistor 44. As a result, a portion of the RF signal entering $RF_{IN}$ is routed through the primary winding 56 through a path as shown by the arrows that are adjacent to the first transistor 42 and the second transistor 44 as well as by the arrow adjacent to the primary winding 56. The controller 60 also outputs a logic low (L) for the signal $V_{BIAS1B}$, which effectively turns off both the third transistor 48 and the fourth transistor 50 as shown in dashed line. As a result of being off, no significant portion of the RF signal can make its way through either the third transistor 48 or the fourth transistor 50.

Similarly, the controller 60 outputs a logic H for the signal $V_{BIAS1C}$, which turns on both the fifth transistor 74 and the sixth transistor 76. As a result, a signal path for the remaining portion of the RF signal is established in the direction shown by the arrows adjacent to the fifth transistor 74 and the sixth transistor 76 as well as by the arrow adjacent to the primary winding 88. The controller also outputs a logic low (L) for the signal $V_{BIAS1D}$, which effectively turns off both the seventh transistor 80 and the eighth transistor 82 as shown in dashed line. As a result of being off, no significant portion of the RF signal can make its way through either seventh transistor 80 or the eighth transistor 82.

Figure 5:
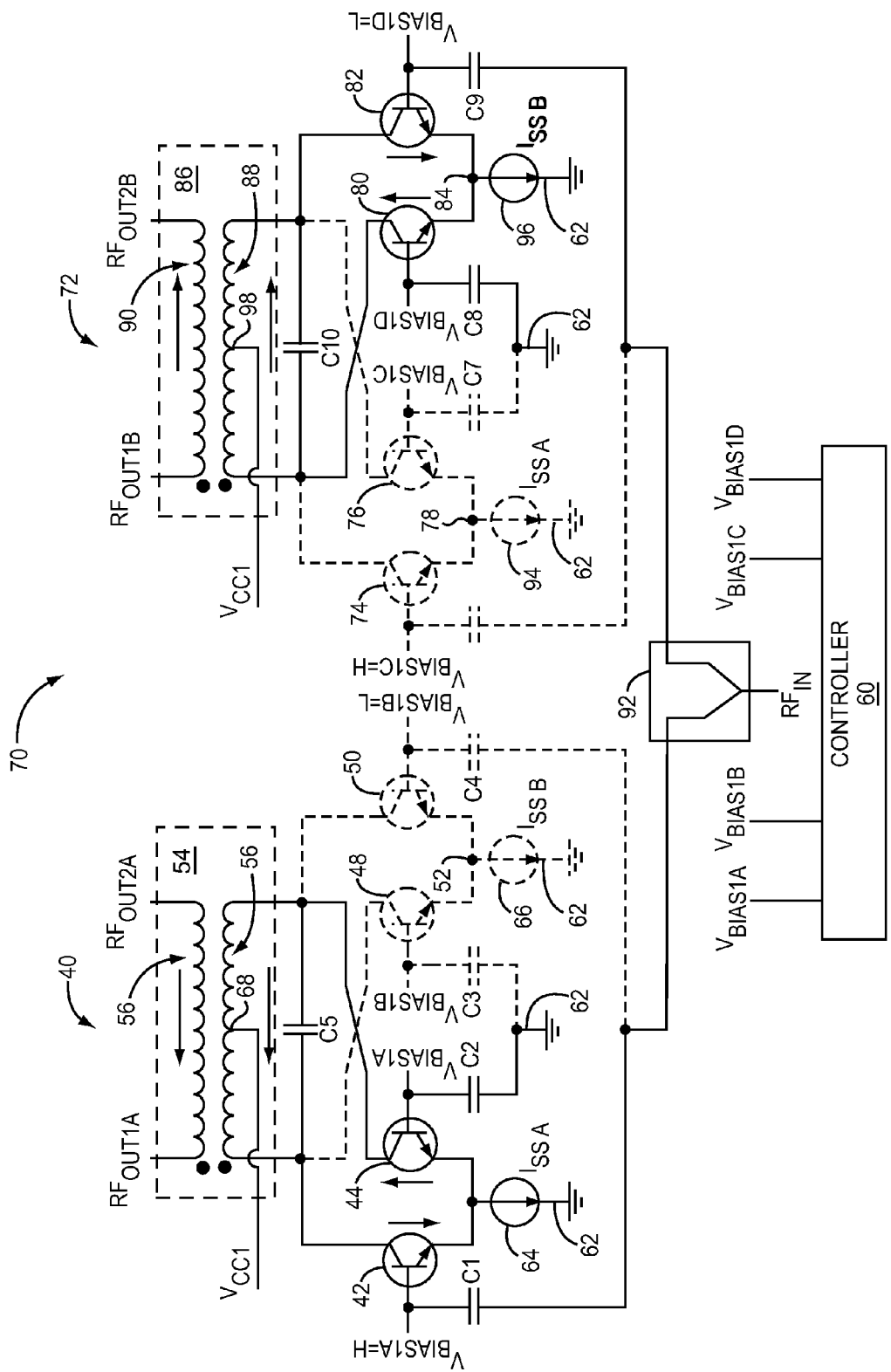
FIG. 5 is an operational schematic diagram showing the phase shifting stage of FIG. 3A in conjunction with the second phase shifting stage in a different operational state.

FIG. 5 is an operational schematic diagram showing the phase shifting stage of FIG. 3A in conjunction with the second phase shifting stage in a different operational state. In this case, as with the example of FIG. 4, the controller 60 outputs a logic high H for the signal $V_{BIAS1A}$. The logic H for the signal $V_{BIAS1A}$ turns on both the first transistor 42 and the second transistor 44, which establishes the RF signal route depicted by the arrows. The controller 60 also outputs a logic low (L) for the signal $V_{BIAS1B}$, which effectively turns off both the third transistor 48 and the fourth transistor 50 as shown in dashed line. As a result of being off, no significant portion of the RF signal can make its way through either the third transistor 48 or the fourth transistor 50.

In contrast to the operational example of FIG. 4, the controller 60 outputs a logic L for $V_{BIAS1C}$ that turns off the fifth transistor 74 and the sixth transistor 76 as shown in dashed line. As a result of being off, no significant portion of the RF signal can make its way through either sixth transistor 76 or the seventh transistor 80. The controller 60 also outputs a logic H for the signal $V_{BIAS1D}$, which turns on both the seventh transistor 80 and the eighth transistor 82. As a result, a signal path for the remaining portion of the RF signal is established in the direction shown by the arrows adjacent to the seventh transistor 80 and the eighth transistor 82 as well as by the arrow adjacent to the primary winding 88. Notice that in this case the phase of the RF signal passing through the primary winding 88 and secondary winding 90 is 180° out of phase with the RF signal passing through the primary winding 88 and secondary winding 90 as shown in FIG. 4.

Figure 6:
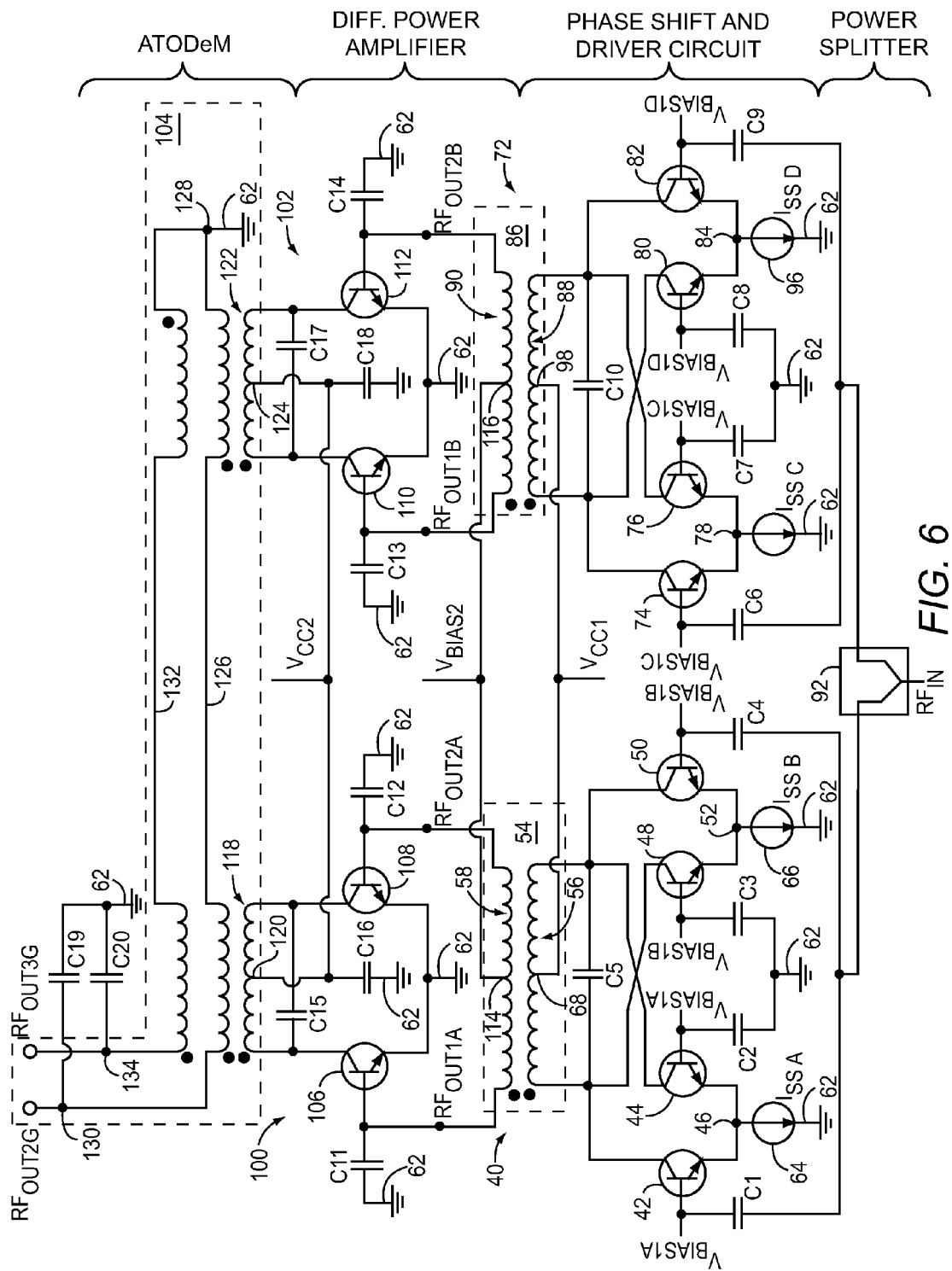
FIG. 6 is a schematic diagram of the phase shifting stages of FIG. 4 coupled to differential power amplifier stages that are coupled to an ATODEM.

FIG. 6 is a schematic diagram of the phase shifting stages of FIG. 4 coupled to a first differential PA stage 100 and a second differential PA stage 102 that are coupled to an ATODEM 104 via first, second, third, and fourth input terminals. The first differential PA stage 100 is made up of a ninth transistor 106 and a tenth transistor 108 that each have a first terminal, a second terminal, and a control terminal, wherein the second terminals of the ninth transistor 106 and the tenth transistor 108 are coupled to the common node 62. The control terminal of the ninth transistor 106 is coupled to the output terminal $RF_{OUT1A}$ of the first transformer 54. The control terminal of the ninth transistor 106 is AC coupled to the common node 62 through a capacitor C11. The control terminal of the tenth transistor 108 is coupled to the output terminal $RF_{OUT2A}$ of the first transformer 54. The control terminal of the tenth transistor 108 is AC coupled to the common node 62 through a capacitor C12.

The second differential PA stage 102 is made up of an eleventh transistor 110 and the twelfth transistor 112 that each have a first terminal, a second terminal, and a control terminal, wherein the second terminals of the eleventh transistor 110 and a twelfth transistor 112 are coupled to the common node 62. The control terminal of the eleventh transistor 110 is coupled to the output terminal $RF_{OUT1B}$ of the second transformer 86. The control terminal of the eleventh transistor 110 is AC coupled to the common node 62 through a capacitor C13. The control terminal of the twelfth transistor 112 is coupled to the output terminal $RF_{OUT2B}$ of the second transformer 86. The control terminal of the twelfth transistor 112 is AC coupled to the common node 62 through a capacitor C14. A bias voltage $V_{BIAS2}$ is fed to the first differential PA stage 100 and the second differential PA stage 102 through a center tap 114 of the secondary winding 58 and a center tap 116 of the secondary winding 90, respectively.

The ATODEM 104 includes a first primary winding 118 having first input terminals for receiving output from the first differential PA stage 100. A capacitor C15 is coupled between the first input terminals of the first primary winding 118 to suppress voltage transient spikes. The first primary winding 118 also includes a center tap 120 that is AC coupled to the common node 62 through a capacitor C16. A supply voltage $V_{CC2}$ feeds the first differential PA stage 100 through the center tap 120.

A second primary winding 122 having second input terminals for receiving output from the second differential PA stage 102. A capacitor C17 is coupled between the second input terminals of the second primary winding 122 to suppress voltage transient spikes. The second primary winding 122 also includes a center tap 124 that is AC coupled to the common node 62 through a capacitor C18. The supply voltage $V_{CC2}$ feeds the second differential PA stage 102 through the center tap 124.

The ATODEM 104 further includes series coupled secondary windings 126 having a common node terminal 128 and a first load terminal 130 for an output $RF_{OUT2G}$ for an RF signal such as a 2G signal. A capacitor C19 coupled between the first load terminal 130 and the common node 62 filters the output $RF_{OUT2G}$. The common node terminal 128 is coupled to the common node 62, which can be at ground potential. Series coupled tertiary windings 132 include the common node terminal 128 and a second load terminal 134 are also included in the ATODEM 104. The second load terminal 134 is for an output $RF_{OUT3G}$ for an RF signal such as a 3G signal. A capacitor C20 coupled between the second load terminal 134 and the common node 62 filters the output $RF_{OUT2G}$.

Figure 7:
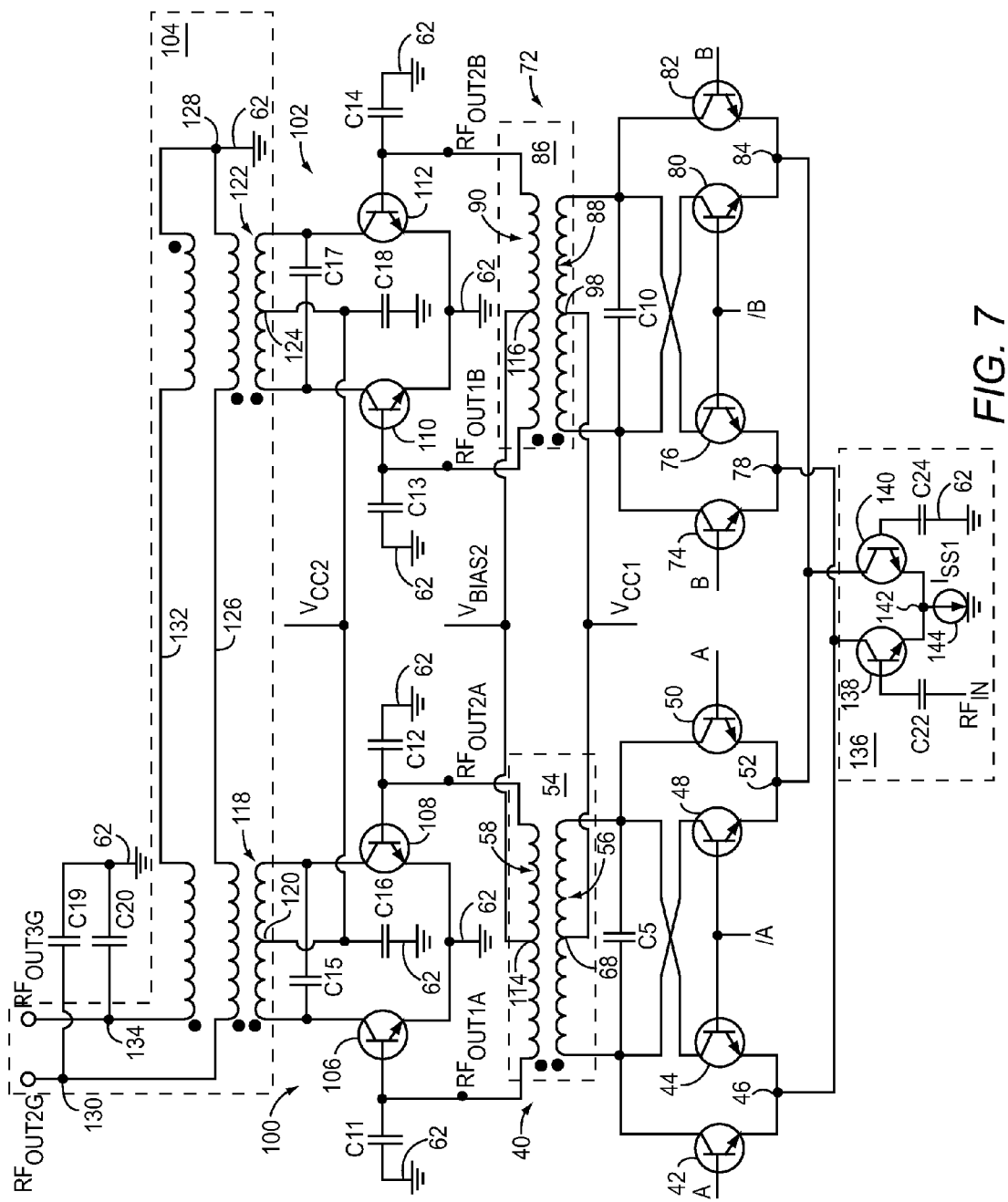
FIG. 7 is a schematic diagram depicting relatively low noise versions of the phase shifting stages coupled to the differential power amplifiers stages and ATODEM of FIG. 6.

FIG. 7 is a schematic diagram depicting relatively low noise versions of the first phase shifting stage 40 and the second phase shifting stage 72, which are coupled to the first differential PA stage 100 and the first differential PA stage 102 along with ATODEM 104. A modification adds a cascode driver 136 to ensure that noise within the first phase shifting stage 40 and the second phase shifting stage 72 is correlated. The cascode driver 136 includes a thirteenth transistor 138 and a fourteenth transistor 140 that each has a first terminal, a second terminal, and a control terminal, wherein the second terminals of the thirteenth transistor 138 and the fourteenth transistor 140 are coupled to a driver current tail node 142. A current source 144 is coupled between the driver current tail node 142 and the common node 62. The RF input terminal $RF_{IN}$ is AC coupled to the control terminal of the thirteenth transistor 138 through a capacitor C22. The control terminal of the fourteenth transistor 140 is AC coupled to the common node 62 through a capacitor C24. The first terminal of the thirteenth transistor 138 is coupled to the first current tail node 46 and the third current tail node 78, whereas the first terminal of the fourteenth transistor 140 is coupled to the second current tail node 52 and the fourth current tail node 84.

Another modification couples the control terminal of the second transistor 44 to the control terminal of the third transistor 48. In this way, the second transistor 44 and the third transistor 48 are driven simultaneous by the same signal. In this case, the second transistor 44 and the third transistor 48 are driven by a signal /A that is a compliment of another signal A that independently drives the first transistor 42 and the fourth transistor 50.

A similar modification couples the control terminal of the sixth transistor 76 to the control terminal of the seventh transistor 80. In this way, the sixth transistor 76 and the seventh transistor 80 are driven simultaneous by the same signal. In this case, the sixth transistor 76 and the seventh transistor 80 are driven by a signal /B that is a compliment of another signal B that independently drives the fifth transistor 74 and the eighth transistor 82.

Figure 8:
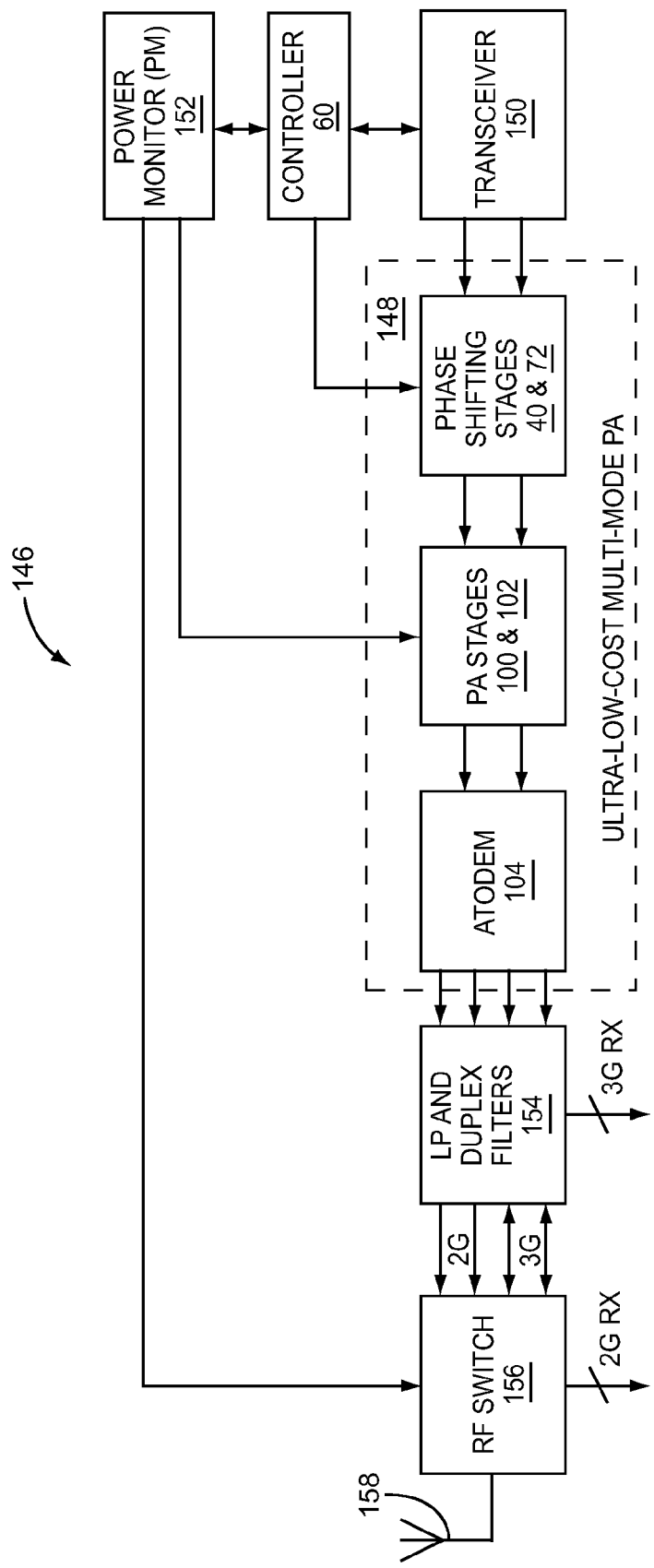
FIG. 8 is a block diagram of a transmit system that includes the phase shifting stages of the present disclosure.

FIG. 8 is a block diagram of a transmit system 146 that includes the first phase shifting stage 40 and second phase shifting stage 72 of the present disclosure. In particular, an ultra-low-cost multi-mode PA section 148 is made up of the first phase shifting stage 40 and the second phase shifting stage 72, the first PA stage 100 and the second PA stage 102 and the ATODEM 104. A transceiver 150 provides signals to the first phase shifting stage 40 and the second phase shifting stage 72 under the control of the controller 60. A power monitor (PM) 152 controls the biasing of the first PA stage 100 and the second PA stage 102. The ATODEM 104 receives combined phase shifted and amplified signals from the first PA stage 100 and the second PA stage 102 to make a switchless selection of signals that are passed to low-pass and duplex filters 154. An RF switch 156 passes selected RF signals along to an antenna 158. The RF switch 156 is also controlled by the controller 60.

Those skilled in the art will recognize improvements and modifications to the preferred embodiments of the present disclosure. All such improvements and modifications are considered within the scope of the concepts disclosed herein and the claims that follow.

What is claimed is:

1. A phase shifting stage comprising:
    a first transistor and a second transistor each having a first terminal, a second terminal, and a control terminal, wherein the second terminals of the first transistor and the second transistor are coupled to a first current tail node;
    a third transistor and a fourth transistor each having a first terminal, a second terminal, and a control terminal, wherein the second terminals of the third transistor and the fourth transistor are coupled to a second current tail node;
    a transformer having a primary winding with a first input, a second input, and a secondary winding with a first output and a second output, wherein the first input is coupled to the first terminals of the first transistor and third transistor, and wherein the second input is coupled to the first terminals of the second transistor and the fourth transistor; and
    a controller having control signals communicatively coupled to the control terminal of each of the first transistor, the second transistor, the third transistor, and the fourth transistor to in one mode route a radio frequency (RF) signal through the primary winding in a first direction and in a second mode route the RF signal through the primary winding in a second direction.

2. The phase shifting stage of claim 1 wherein a first one of the control signals is communicatively coupled to the control terminals of the first transistor and the second transistor and a second one of the control signals is communicatively coupled to the control terminals of the third transistor and the fourth transistor.

3. The phase shifting stage of claim 1 wherein the controller is adapted to route the RF signal coupled to the control terminal of the first transistor and the control terminal of the fourth transistor through the primary winding in one direction by switching on the first transistor and the second transistor via a first one of the control signals while switching off the third transistor and the fourth transistor via a second one of the control signals.

4. The phase shifting stage of claim 3 wherein the controller is further adapted to route the RF signal coupled to the control terminal of the first transistor and the control terminal of the second transistor through the primary winding in an opposite direction by switching off the first transistor and the second transistor via the first one of the control signals while switching on the third transistor and the fourth transistor via the second one of the control signals.

5. The phase shifting stage of claim 1 further including a first current source coupled between the first current tail node and a common node and a second current source coupled between the second current tail node and the common node.

6. The phase shifting stage of claim 1 wherein the primary winding is center tapped and coupled to a dc voltage that supplies power to the first transistor, the second transistor, the third transistor, and the fourth transistor.

7. The phase shifting stage of claim 1 wherein the control terminal of the second transistor is coupled to a common node via a first capacitor and the control terminal of the third transistor is coupled to the common node via a second capacitor.

8. The phase shifting stage of claim 1 further including a capacitor coupled between the first input and the second input of the primary winding.

9. A transmit system comprising:
a transceiver having signal outputs; and
at least two phase shifting stages having inputs coupled to the signal outputs, each of the at least two phase shifting stages comprising:
a first transistor and a second transistor each having a first terminal, a second terminal, and a control terminal, wherein the second terminals of the first transistor and the second transistor are coupled to a first current tail node;
a third transistor and a fourth transistor each having a first terminal, a second terminal, and a control terminal, wherein the second terminals of the third transistor and the fourth transistor are coupled to a second current tail node;
a transformer having a primary winding with a first input, a second input and a secondary winding with a first output and a second output, wherein the first input is coupled to the first terminals of the first transistor and third transistor, and wherein the second input is coupled to the first terminals of the second transistor and the fourth transistor; and
a controller having control signals communicatively coupled to the control terminal of each of the first transistor, the second transistor, the third transistor, and the fourth transistor of each of the at least two phase shifting stages to in one mode route a radio frequency (RF) signal through the primary winding of each of the at least two phase shifting stages in a first direction and in a second mode route the RF signal through the primary winding of each of the at least two phase shifting stages in a second direction.

10. The transmit system of claim 9 wherein first ones of the control signals are communicatively coupled to the control terminals of the first transistor and the second transistor of each of the at least two phase shifting stages and second ones of the control signals are communicatively coupled to the control terminals of the third transistor and the fourth transistor of each of the at least two phase shifting stages.

11. The transmit system of claim 10 wherein the controller is adapted to route the RF signal coupled to the control terminal of the first transistor and the control terminal of the fourth transistor through the primary winding of each of the at least two phase shifting stages in one direction by switching on the first transistor and the second transistor of each of the at least two phase shifting stages via the first ones of the control signals while switching off the third transistor and the fourth transistor of each of the at least two phase shifting stages via the second ones of the control signals.

12. The transmit system of claim 11 wherein the controller is further adapted to route the RF signal coupled to the control terminal of the first transistor and the control terminal of the second transistor through the primary winding of each of the at least two phase shifting stages in an opposite direction by switching off the first transistor and the second transistor of each of the at least two phase shifting stages via the first ones of the control signals while switching on the third transistor and the fourth transistor of each of the at least two phase shifting stages via the second ones of the control signals.

13. The transmit system of claim 9 further including a first current source coupled between the first current tail node of each of the at least two phase shifting stages and a common node and a second current source coupled between the second current tail node of each of the at least two phase shifting stages and the common node.

14. The transmit system stage of claim 9 wherein the primary winding of each of the at least two phase shifting stages is center tapped and coupled to a dc voltage that supplies power to the first transistor, the second transistor, the third transistor, and the fourth transistor of each of the at least two phase shifting stages.

15. The transmit system of claim 9 wherein the control terminal of the second transistor of each of the at least two phase shifting stages is coupled to a common node via a first capacitor and the control terminal of the third transistor of each of the at least two phase shifting stages is coupled to the common node via a second capacitor.

16. The transmit system of claim 9 further including a capacitor coupled between the first input and second input of the primary winding of each of the at least two phase shifting stages.

* * * * *